(12) United States Patent
Takesako et al.

(10) Patent No.: US 10,910,380 B2
(45) Date of Patent: Feb. 2, 2021

(54) METHOD OF MANUFACTURING DYNAMIC RANDOM ACCESS MEMORY

(71) Applicant: Winbond Electronics Corp., Taichung (TW)

(72) Inventors: Kazuaki Takesako, Kanagawa (JP); Huang-Nan Chen, Taichung (TW); Wei-Che Chang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/716,495

(22) Filed: Dec. 17, 2019

(65) Prior Publication Data

US 2020/0119020 A1 Apr. 16, 2020

Related U.S. Application Data

(63) Continuation of application No. 15/997,706, filed on Jun. 5, 2018, now abandoned.

(30) Foreign Application Priority Data

Jul. 12, 2017 (CN) .......................... 2017 1 0564443

(51) Int. Cl.
*H01L 27/108* (2006.01)
*H01L 23/528* (2006.01)
(Continued)

(52) U.S. Cl.
CPC .... *H01L 27/10814* (2013.01); *H01L 21/0217* (2013.01); *H01L 21/02164* (2013.01);
(Continued)

(58) Field of Classification Search
CPC ............ H01L 27/10814; H01L 23/528; H01L 27/10823; H01L 21/76224;
(Continued)

(56) References Cited

U.S. PATENT DOCUMENTS 9,613,967 B1* 4/2017 Chien ............... H01L 27/10894
2008/0283816 A1* 11/2008 Takaishi .................. H01L 27/24
257/4

(Continued)

FOREIGN PATENT DOCUMENTS

CN 105990370 10/2016

OTHER PUBLICATIONS

"Office Action of China Counterpart Application", dated Apr. 20, 2020, p. 1-p. 10.

*Primary Examiner* — Thanh T Nguyen
(74) *Attorney, Agent, or Firm* — JCIPRNET

(57) ABSTRACT

A method of manufacturing a DRAM includes isolation structures and word line sets are formed in the substrate. A conductive material is formed on the substrate. Conductive material is removed to form first openings in the conductive material. The first openings expose surfaces of the substrate in the first areas and divide the conductive material into conductive layers, thereby the conductive layers are located on surfaces of the substrate in the second areas. A first dielectric material is filled in the first openings so as to form first dielectric layers on the substrate in the first areas. Top surfaces of the conductive layers are lower than top surfaces of the first dielectric layers. Second dielectric layers are formed respectively in the conductive layers. Capacitors are formed respectively on the conductive posts.

14 Claims, 15 Drawing Sheets

(51) Int. Cl.
   *H01L 21/762* (2006.01)
   *H01L 21/02* (2006.01)
   *H01L 21/311* (2006.01)
   *H01L 29/06* (2006.01)
   *H01L 21/3105* (2006.01)
   *H01L 21/285* (2006.01)
   *H01L 21/033* (2006.01)
   *H01L 21/027* (2006.01)
   *H01L 21/3213* (2006.01)

(52) U.S. Cl.
   CPC .. *H01L 21/31111* (2013.01); *H01L 21/76224* (2013.01); *H01L 23/528* (2013.01); *H01L 27/10823* (2013.01); *H01L 27/10855* (2013.01); *H01L 27/10876* (2013.01); *H01L 27/10885* (2013.01); *H01L 27/10888* (2013.01); *H01L 27/10891* (2013.01); *H01L 29/0649* (2013.01); H01L 21/0214 (2013.01); H01L 21/0273 (2013.01); H01L 21/02115 (2013.01); H01L 21/02271 (2013.01); H01L 21/0332 (2013.01); H01L 21/28525 (2013.01); H01L 21/31053 (2013.01); H01L 21/32139 (2013.01)

(58) Field of Classification Search
   CPC ......... H01L 27/10891; H01L 27/10885; H01L 27/10855; H01L 21/0217; H01L 21/02164; H01L 21/31111; H01L 29/0649; H01L 27/10876; H01L 27/10888; H01L 21/32139; H01L 21/02271; H01L 21/28525; H01L 21/0214; H01L 21/02115; H01L 21/0332; H01L 21/0273; H01L 21/31053
   See application file for complete search history.

(56) References Cited

U.S. PATENT DOCUMENTS

| | | | |
|---|---|---|---|
| 2011/0221034 A1* | 9/2011 | Kawakita | H01L 21/7682 257/532 |
| 2013/0193549 A1 | 8/2013 | Lee | |
| 2014/0367775 A1* | 12/2014 | Min | H01L 29/42356 257/334 |
| 2016/0204201 A1 | 7/2016 | Oh et al. | |
| 2017/0018552 A1 | 1/2017 | Moon et al. | |

* cited by examiner

METHOD OF MANUFACTURING DYNAMIC RANDOM ACCESS MEMORY

CROSS-REFERENCE TO RELATED APPLICATION

This is a continuation application of patent application Ser. No. 15/997,706, filed on Jun. 5, 2018, which claims the priority benefit of China application serial no. 201710564443.7, filed on Jul. 12, 2017. The entirety of each of the above-mentioned patent applications is hereby incorporated by reference herein and made a part of this specification.

BACKGROUND

Field of the Invention

The invention relates to a memory device and a method of manufacturing the same and more particularly, to a dynamic random access memory (DRAM) and a method of manufacturing the same.

Description of Related Art

A dynamic random access memory (DRAM) is a volatile memory formed by a plurality of memory cells. Each of the memory cells is mainly composed of a transistor and a capacitor controlled by the transistor, and the memory cells are electrically connected with one another through word lines and bit lines. In order to improve the integration of DRAM to increase the operating speed of the device and to meet the consumers' demand for miniaturization of electronic devices, buried word line DRAM has been developed in recent years for the aforementioned purposes.

In the related art, a parasitic capacitance between two adjacent bit lines is usually reduced by using a thick bit line spacer. However, in the condition of the increased integration and the miniaturized device size, the thick bit line spacer may cause reduction of a linewidth of a capacitor contact, such that a contact area between the capacitor contact and an active area is reduced. Due to the reduced contact area between the capacitor contact and the active area, a resistance between the capacitor contact and the active area is increased, and as a result, product reliability is reduced. Therefore, how to develop a DRAM and a method of manufacturing the same capable of reducing the parasitic capacitance between the adjacent bit lines as well as maintaining the contact area between the capacitor contact and the active area will become an important subject.

SUMMARY

The invention provides a dynamic random access memory (DRAM) and a method of manufacturing the same capable of reducing a parasitic capacitance between adjacent bit lines and maintaining a contact area between a capacitor contact and an active area.

A dynamic random access memory (DRAM) including a substrate, a plurality of isolation structures, a plurality of word line sets, a plurality of bit-line structures, a plurality of spacers, a plurality of capacitors and a plurality of capacitor contacts is provided. The isolation structures are located in the substrate to divide the substrate into a plurality of active areas. The active areas are configured in a shape of band and arranged in an array. The word line sets are disposed in parallel in a Y direction in the substrate. The bit-line structures are disposed in parallel in an X direction on the substrate and cross the word line sets. The spacers are disposed in parallel in the X direction on sidewalls of the bit-line structures and include silicon oxide. The capacitors are respectively disposed at two terminals of a long side of each of the active areas. The capacitor contacts are respectively located between the capacitors and the active areas.

A method of manufacturing a DRAM is provided. The method includes the following steps. A plurality of isolation structures are formed in a substrate to divide the substrate into a plurality of active areas. The active areas are configured in a shape of band and arranged in an array. A plurality of word line sets are formed in the substrate. The word line sets extend in a Y direction and pass through the isolation structures and the active areas to divide the substrate into a plurality of a plurality of first areas and a plurality of second areas. The first areas and the second areas are alternately arranged in an X direction, and the word line sets are located in the first areas. A plurality of bit-line structures are formed on the substrate. The bit-line structures extend in the X direction and cross the word line sets. A plurality of spacers are formed respectively on sidewalls of the bit-line structures. A plurality of conductive layers are formed on the substrate in the second areas. A plurality of first dielectric layers are formed on the substrate in the first areas. Top surfaces of the conductive layers are lower than top surfaces of the first dielectric layers. A plurality of second dielectric layers are formed respectively in the conductive layers. Each of the second dielectric layers divides the corresponding conductive layer into two conductive posts. A material of the first dielectric layers is the same as a material of the second dielectric layers. A plurality of capacitors are formed respectively on the conductive posts.

Based on the above, in the invention, the conductive layer is first formed, the first dielectric layers and the second dielectric layers are then formed in the conductive layers to divide each of the conductive layers into a plurality of conductive posts (or capacitor contacts). Thus, the invention can contribute to simplifying the method of manufacturing the capacitor contacts to maintaining the capacitor contacts in the post structures. Meanwhile, the bottom width of the formed capacitor contacts can be greater than or equal to the top width of the capacitor contact, such that the resistance between the capacitor contacts and the active areas can be reduced. Thereby, a reading speed of the DRAM can be increased, so as to enhance product efficiency and reliability. Moreover, the material of the spacers disposed on the sidewalls of the bit-line structures is substituted by silicon oxide in the invention to reduce the parasitic capacitance between each adjacent bit-line structures, so as to increase the memory performance. In addition, the material of the dielectric layers beside the capacitor contacts is substituted by silicon nitride in the invention, and thereby, a short-circuit issue occurring to the two adjacent capacitor contacts due to over etching can be prevented.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
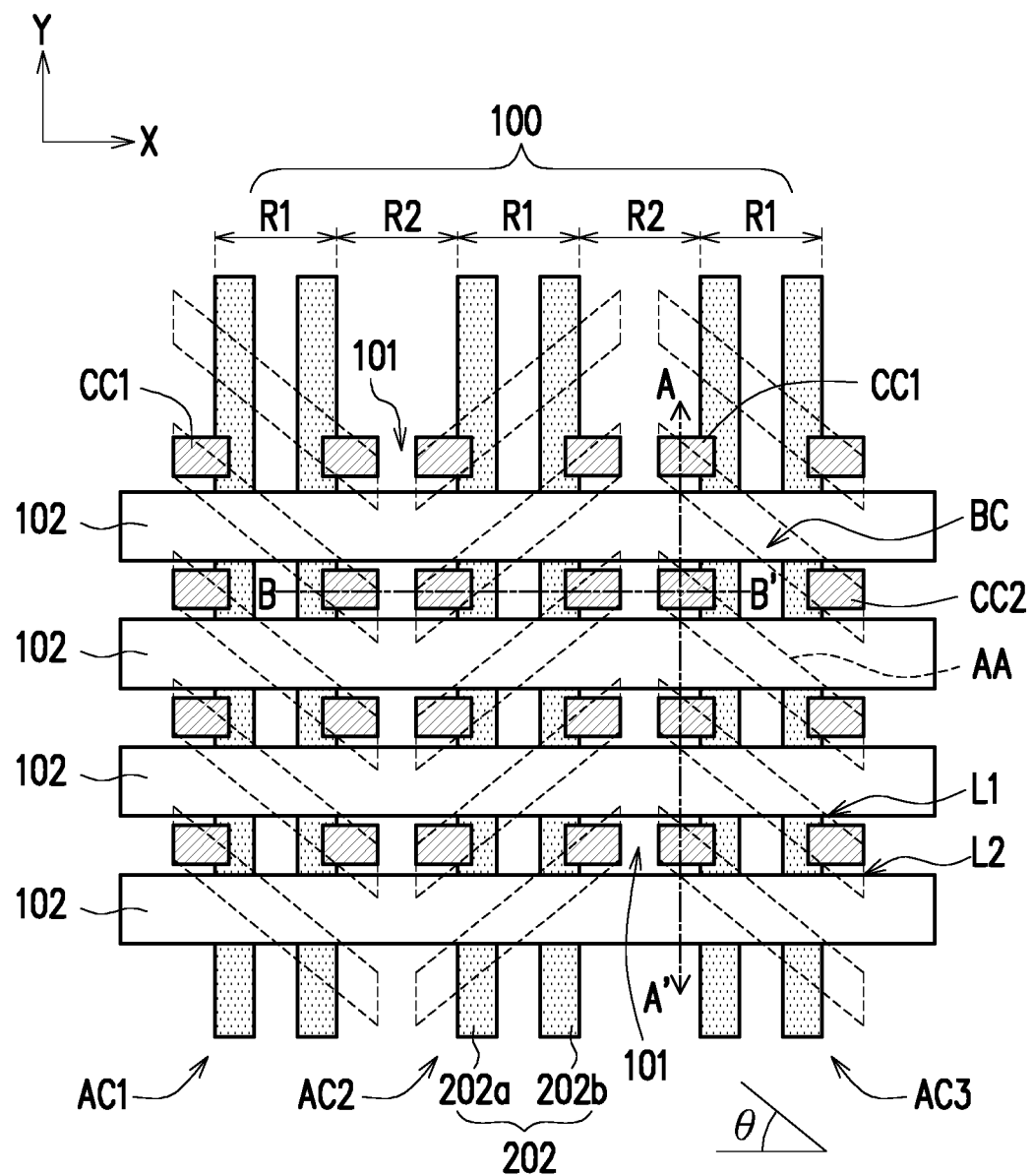
FIG. 1 is a schematic top view of a dynamic random access memory (DRAM) according to an embodiment of the invention.

The invention will be described more comprehensively with reference to the figures of the present embodiments. However, the invention may also be implemented in various forms, and is not limited to the embodiments in the present specification. The thicknesses of the layers and regions in the figures are enlarged for clarity. The same or similar reference numerals represent the same or similar devices and will not be repeated in the following paragraphs.

FIG. 1 is a schematic top view of a dynamic random access memory (DRAM) according to an embodiment of the invention. Referring to FIG. 1, the present embodiment provides a DRAM including a substrate 100, a plurality of isolation structures 101, a plurality of active areas AA, a plurality of bit-line structures 102, a plurality of word line sets 202 and a plurality of capacitor contacts CC1 and CC2. For clearness of the figure, FIG. 1 only illustrates the aforementioned elements, and other elements may refer to the cross-sectional views illustrated in subsequent FIG. 2A to FIG. 7.

As illustrated in FIG. 1, the substrate 100 includes a plurality of first areas R1 and a plurality of second areas R2. The first areas R1 and the second areas R2 are alternately arranged in an X direction. The isolation structures 101 are disposed in the substrate 100 to define the active areas AA in the substrate 100. In other words, one isolation structures 101 is provided between adjacent two active areas AA. In an embodiment, only one memory unit is formed on one active area AA, and each of the memory units is separated by the isolation structure 101, so as to effectively reduce an interference issue among the memory units. Specifically, the active areas AA are configured in a shape of band and arranged in an array. In the present embodiment, the active areas AA are arranged in three active area columns AC1 to AC3, and each two adjacent active area columns are disposed in a mirror manner. For instance, a long-side direction of the active area column AC3 and the X direction are not orthogonal to each other and have an included angle θ, and a long-side direction of the active area column AC2 and the X direction are not orthogonal to each other and have an included angle (180°-θ). In an embodiment, the included angle θ may range between 15 degrees and 75 degrees. However, the invention is not limited thereto, in other embodiments, each two adjacent active area columns may also be disposed in the same manner.

The bit-line structures 102 are located on the substrate 100 and cross the first areas R1 and the second areas R2. The bit-line structures 102 extend in the X direction and are arranged with each other along a Y direction. The word line sets 202 are located in the first areas R1 of the substrate 100. The word line sets 202 are disposed along the Y direction and arranged with each other in the X direction. Each word line set 202 has two buried word lines 202a and 202b. In an embodiment, the X direction and the Y direction are substantially vertical to each other.

In the present embodiment, each active area AA has a long side L1 and a short side L2, and the long side L1 crosses the corresponding word line set 202 (i.e., including two buried word lines 202a and 202b), and an overlapping area of each active area AA and its corresponding bit-line structure 102 has a bit line contact BC. Thus, each bit-line structure 102 crossing its corresponding word line set 202, may be electrically connected with a corresponding doped area (not shown) through the bit line contact BC. The doped area is located between the two buried word lines 202a and 202b.

The capacitor contacts CC1 and CC2 are located between the bit-line structures 102 on the substrate 100. Specifically, the capacitor contacts CC1 and CC2 are respectively disposed at two terminals of the long side L1 of each active area AA and may electrically connect the active areas AA with subsequently formed capacitors (not shown). In addition, even though the capacitor contacts CC1 and CC2 are presented in a rectangular shape in FIG. 1, the actually formed contacts is slightly represented in a circular shape and sizes thereof may be designed based on process requirements.

Figure 2A:
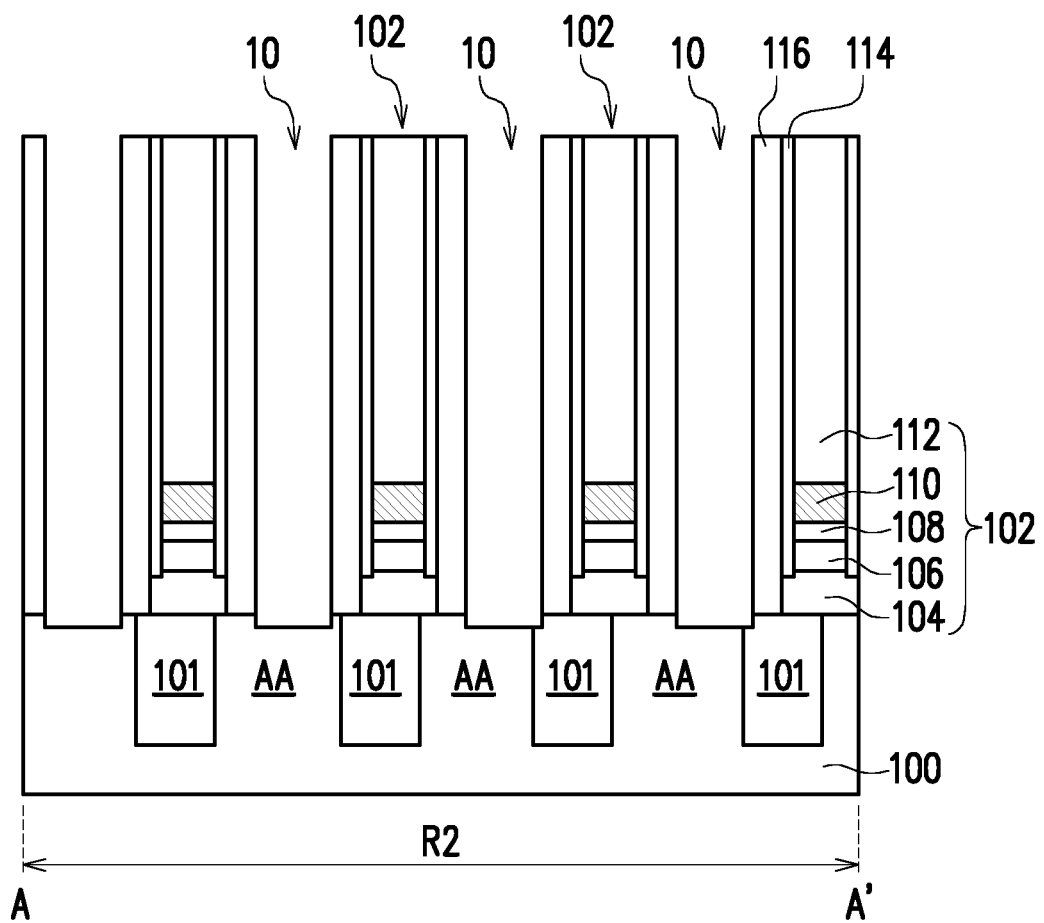
FIG. 2A to FIG. 2C are schematic cross-sectional views of a manufacturing process of the DRAM along line A-A' depicted in FIG. 1.
Figure 2B:
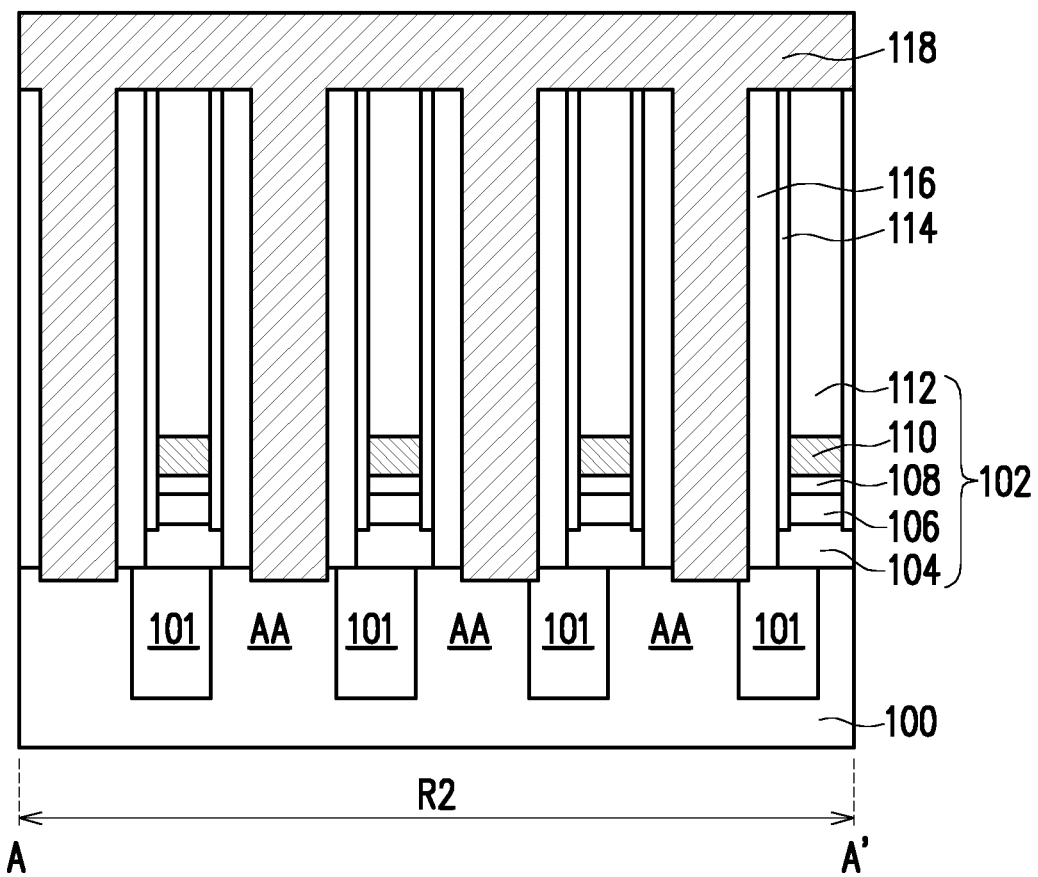
Figure 2C:
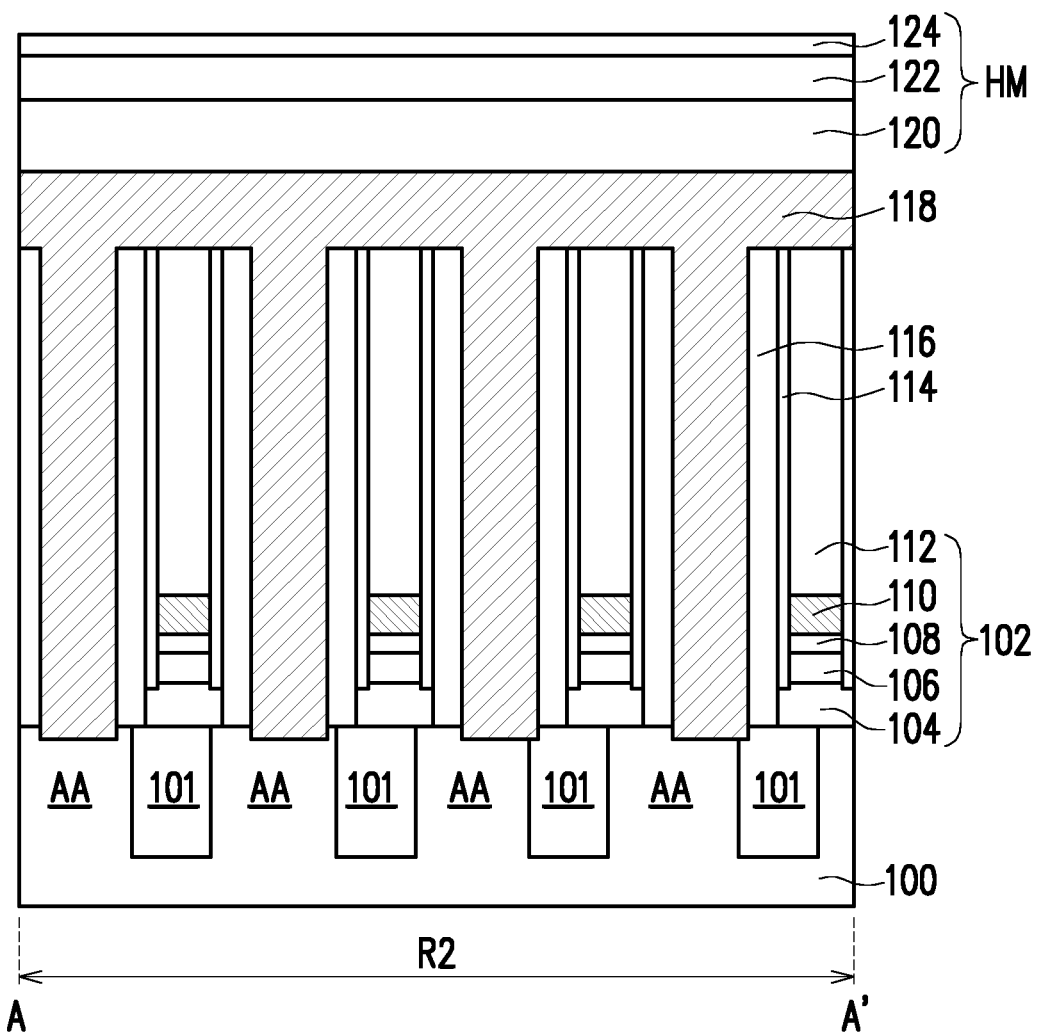

FIG. 2A to FIG. 2C are schematic cross-sectional views of a manufacturing process of the DRAM along line A-A' depicted in FIG. 1. FIG. 3A to FIG. 3E, FIG. 4, FIG. 5A to FIG. 5C and FIG. 6 to FIG. 7 are schematic cross-sectional views of a manufacturing process of the DRAM along line B-B' depicted in FIG. 1.

Referring to FIG. 1 and FIG. 2A simultaneously, the present embodiment provides a method of manufacturing a DRAM, which includes the following steps. First, an initial structure including a substrate 100, a plurality of isolation structures 101 and a plurality of word line sets 202 is provided. The isolation structures 101 and the word line sets 202 are both located in the substrate 100. As the word line sets 202 are not illustrated in the cross-sections of FIG. 2A to FIG. 2C, detailed description related to the word line sets 202 will be set forth below with reference to FIG. 3A. In the present embodiment, the substrate 100 may be, for example, a semiconductor substrate, a semiconductor compound substrate or a semiconductor over insulator (SOI).

As illustrated in FIG. 1 and FIG. 2A, the isolation structures 101 are disposed in the substrate 100 to divide the substrate 100 into a plurality of active areas AA. In an embodiment, the isolation structures 101 include a dielectric material, and the dielectric material may be silicon oxide. In an embodiment, the isolation structures 101 may be, for example, shallow trench isolation (STI) structures.

Figure 3A:
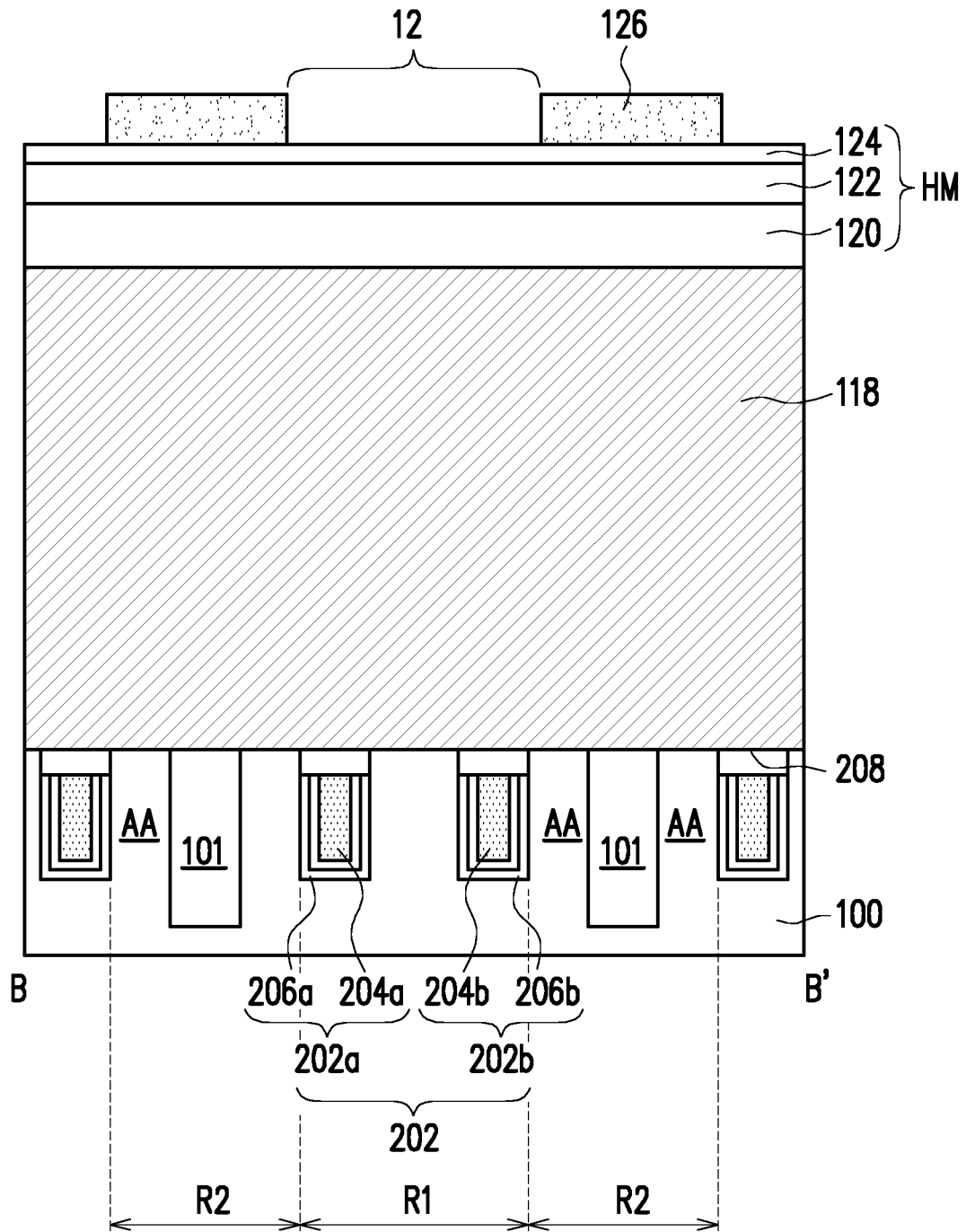
FIG. 3A to FIG. 3E, FIG. 4, FIG. 5A to FIG. 5C and FIG. 6 to FIG. 7 are schematic cross-sectional views of a manufacturing process of the DRAM along line B-B' depicted in FIG. 1.

As illustrated in FIG. 1 and FIG. 3A, the word line sets 202 are disposed on the substrate 100 in the first areas R1. Specifically, each word line set 202 includes two buried word lines 202a and 202b. Each buried word line 202a includes a gate 204a and a gate dielectric layer 206a. The gate dielectric layer 206a surrounds the gate 204a to electrically isolate the gate 204a from the substrate 100. In an embodiment, a material of the gate 204a includes, for example, a conductive material, which may be, for example, a metal material, a barrier metal material or a combination thereof, and a method of forming the gate 204a may be a chemical vapor deposition (CVD) method or a physical vapor deposition (PVD) method. A material of the gate dielectric layer 206a may be, for example, silicon oxide, and a method of forming the gate dielectric layer 206a may be a chemical vapor deposition (CVD) method, a thermal oxidation method, an in situ steam generation (ISSG) method or the like. Similarly, another buried word line 202b also includes a gate 204b and a gate dielectric layer 206b. The gate dielectric layer 206b surrounds the gate 204b to electrically isolate the gate 204b from the substrate 100. Additionally, the initial structure further includes a silicon nitride layer 208. Specifically, the silicon nitride layer 208 is disposed on the buried word lines 202a and 202b. In an embodiment, a method of forming the silicon nitride layer 208 may be a chemical vapor deposition (CVD) method.

Referring back to FIG. 1 and FIG. 2A, the bit-line structures 102 are formed on the initial structure (or the substrate 100). Referring to the cross-section of FIG. 2A, each bit-line structure 102, from bottom to top, includes a silicon oxide layer 104, a silicon nitride layer 106, a barrier layer 108, a bit line 110 and a cap layer 112. The first spacer 114 covers a sidewall of the silicon nitride layer 106, a sidewall of the barrier layer 108, a sidewall of the bit line 110 and a sidewall of the cap layer 112. The second spacer 116 covers a sidewall of the first spacer 114 and a sidewall of the silicon oxide layer 104. On the other hand, along the cross-section of the active areas AA, each bit-line structure 102, for bottom to top, includes a bit line contact (not shown), the barrier layer 108, the bit line 110 and the cap layer 112. The bit-line structures 102 may be electrically connected to the active areas AA (which are source/drain doped areas) through the bit line contacts (not shown).

In an embodiment, a material of the bit line contact (not shown) may be polysilicon or silicon germanium. A material of the barrier layer 108 includes a barrier metal material which may be, for example, TiN. A material of the bit line 110 may be a metal material which may be, for example, W. A material of the cap layer 112 may be silicon nitride. In addition, a metal silicide layer (not shown) may be provided between the bit line contact (not shown) and the bit line 110, which may be, for example, TiSi, CoSi, NiSi or a combination thereof.

It should be noted that the first spacers 114 and the second spacers 116 may be strip-shaped, extend in the X direction and protect sidewalls of the bit-line structures 102 to electrically isolate the bit-line structures 102 from a subsequently formed conductive material 118 (as illustrated in FIG. 2B). Additionally, a material of the first spacers 114 may be silicon nitride, and a material of the second spacers 116 may be silicon oxide. A method of forming the first spacers 114 and the second spacers 116 is similar to a method of forming conventional spacers and will not be described in detail. In an embodiment, as the second spacers 116 are made of silicon oxide, in comparison with the conventional silicon nitride, the second spacers 116 of the present embodiment may effectively reduce parasitic capacitance between each adjacent bit-line structures 102, so as to enhance memory performance. However, the invention is not limited thereto, the material of the second spacers 116 may be any other low dielectric constant material (i.e., a dielectric material with a dielectric constant lower than 4). Furthermore, after the first spacers 114 and the second spacers 116 are formed, a plurality of openings 10 are provided between the bit-line structures 102. The openings 10 at least expose a top surface of the substrate 100 (or the active areas AA). In an alternative embodiment, as illustrated in FIG. 2A, a part of the silicon substrate 100 may be removed, such that bottom surfaces of the openings 10 are lower than the top surface of the substrate 100.

Referring to FIG. 2A and FIG. 2B simultaneously, a conductive material 118 is formed over the initial structure (or the substrate 100). The conductive material 118 is filled in the openings 10 between the bit-line structures 102 and extends to cover top surfaces of the bit-line structures 102. The conductive material 118 may be polysilicon and a forming method thereof may be a chemical vapor deposition (CVD).

Referring to FIG. 2B and FIG. 2C simultaneously, a silicon oxide layer 120, a carbon layer 122 and a silicon oxynitride layer 124 are sequentially formed over the conductive material 118. In an embodiment, a composite layer including the silicon oxide layer 120, the carbon layer 122 and the silicon oxynitride layer 124 may be considered as a hard mask layer HM. In an embodiment, the silicon oxide layer 120 may be, for example, tetraethyl orthosilicate (TEOS).

Referring to FIG. 2C and FIG. 3A simultaneously, a photoresist pattern 126 is formed on the silicon oxynitride layer 124 (or the hard mask layer HM). The photoresist pattern 126 has a plurality of openings 12. The openings 12 may be strip-shaped openings which extend in the Y direction and expose a part of a surface of the silicon oxynitride layer 124. On the other hand, the openings 12 are only located on the substrate 100 in the first areas R1 and correspond to the word line sets 202 in the substrate 100 in the first areas R1. Additionally, as the openings 12 are only illustrated in the cross-section along line B-B' of FIG. 1 (i.e., FIG. 3A), the follow-up manufacturing process will be described with reference to the cross-section along line B-B' of FIG. 1.

Figure 3B:
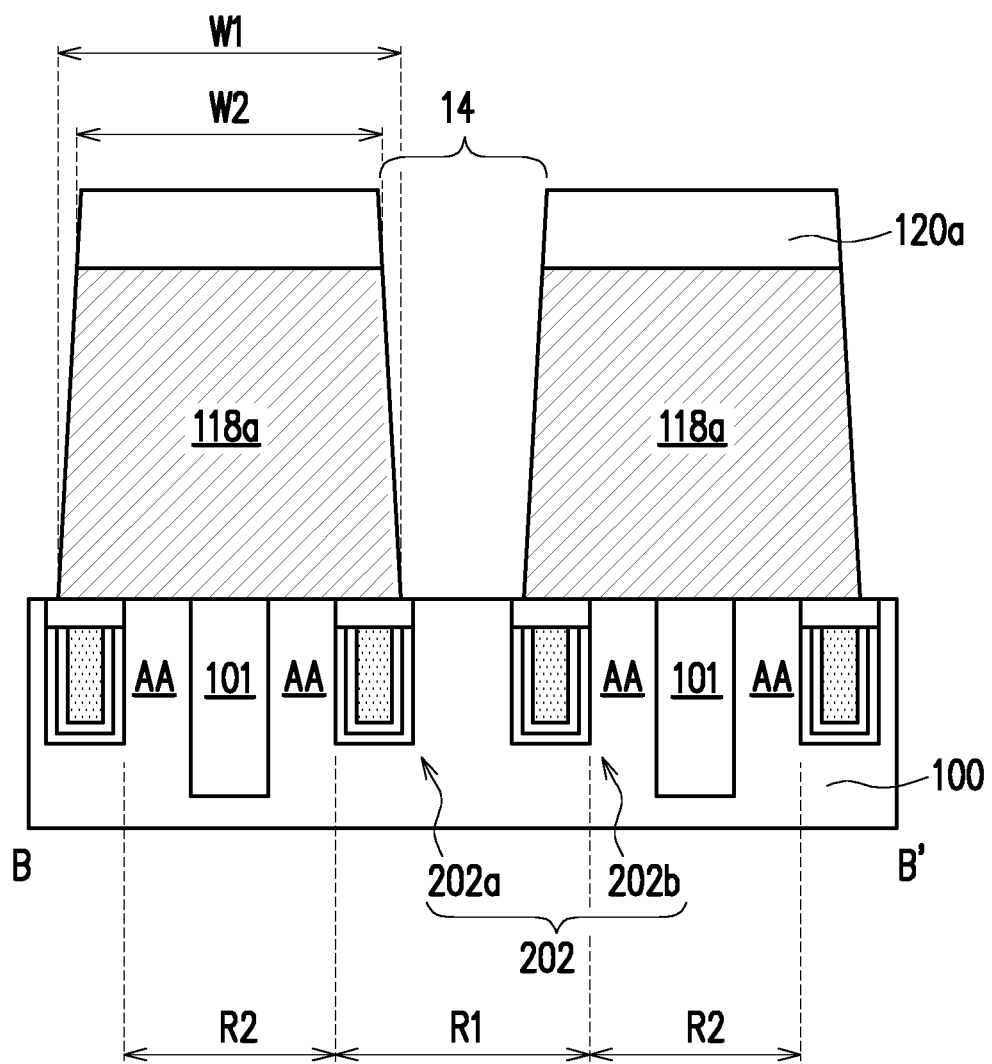

Referring to FIG. 3A and FIG. 3B simultaneously, with the photoresist pattern 126 employed as a mask, a part of the hard mask layer HM and a part of the conductive material 118 are removed to form a plurality of openings 14 in remaining silicon oxide layer 120a and conductive layer 118a. The openings 14 may be strip-shaped openings which extend in the Y direction and expose the top surface of the substrate 100 in the first areas R1. In other words, the openings 14 separate each two adjacent conductive layers 118a, such that the conductive layers 118a are located on the substrate 100 in the second areas R2. As illustrated in FIG. 3B, each conductive layer 118a may have a bottom width W1 and a top width W2. In an embodiment, the bottom width W1 may be greater than or equal to top width W2. The conductive layers 118a at least cover the top surface of the substrate 100 (or the active areas AA) in the second areas R2.

Figure 3C:
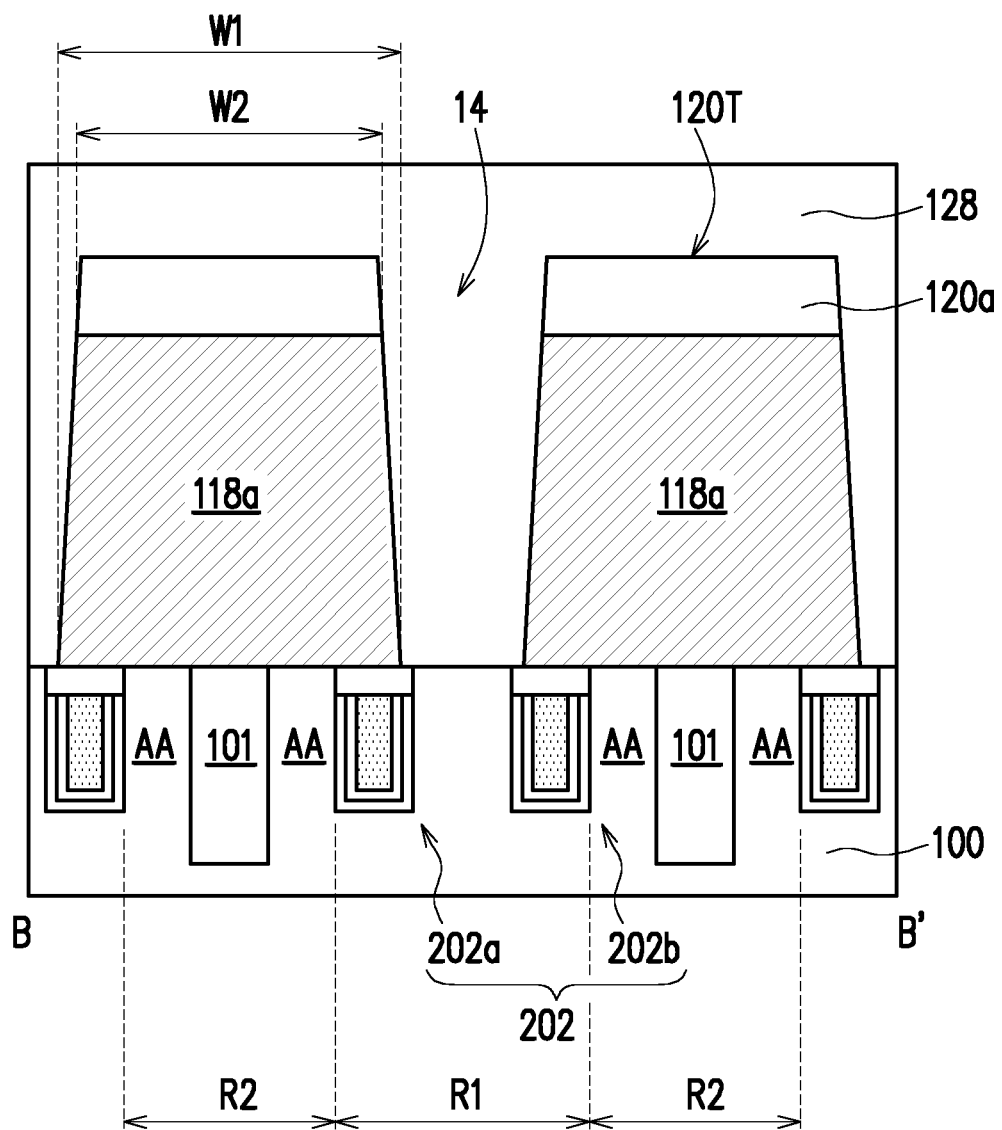

Referring to FIG. 3B and FIG. 3C simultaneously, a first dielectric material 128 is formed on the substrate 100. The first dielectric material 128 is filled in to the openings 14 and covers a top surface 120T of each remaining silicon oxide layer 120a. In an embodiment, the first dielectric material 128 may be silicon nitride.

Figure 3D:
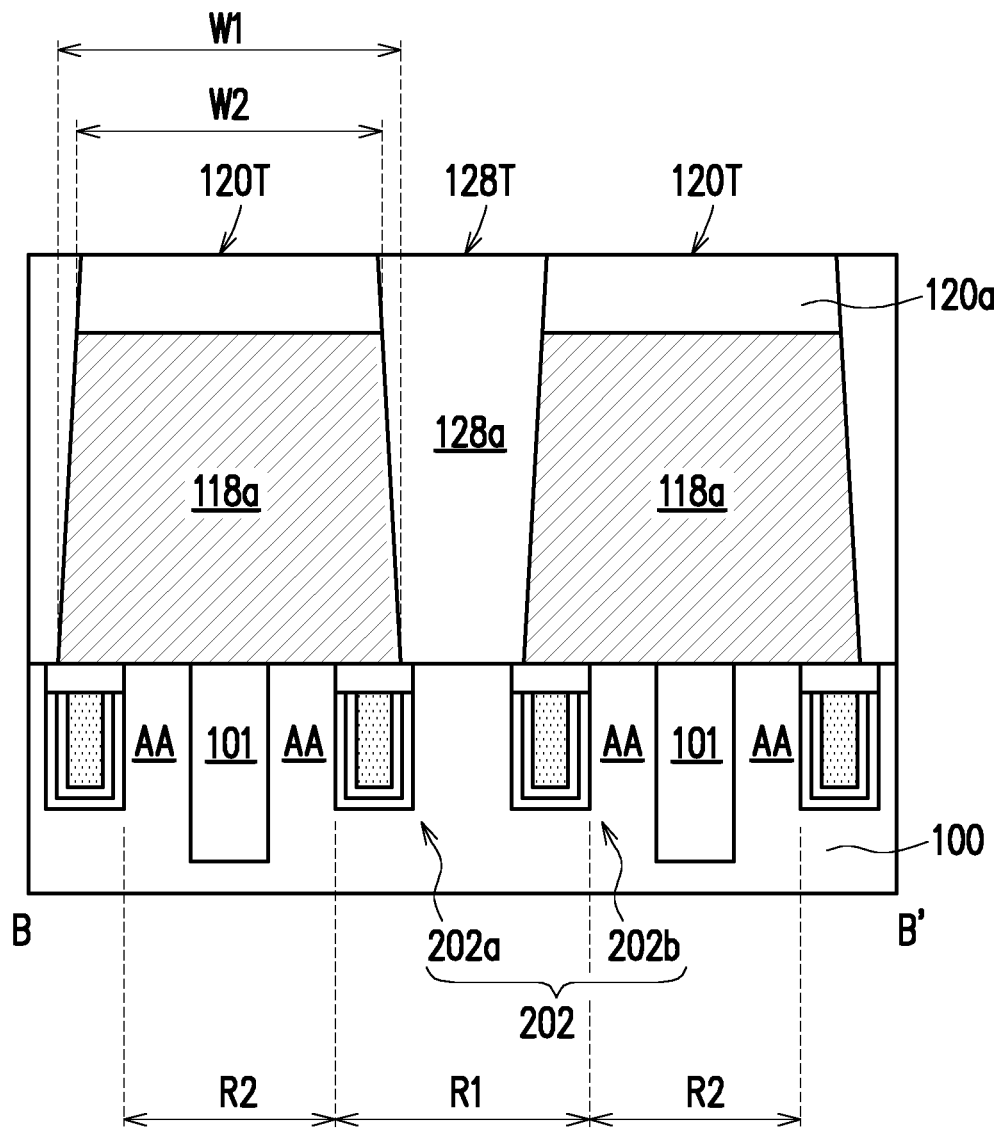

Referring to FIG. 3C and FIG. 3D simultaneously, a planarization process is performed to remove a part of the first dielectric material 128, so as to form a first dielectric layer 128a on the substrate 100 in the first area R1. As illustrated in FIG. 3D, the top surface 128T of the first dielectric layer 128a is substantially coplanar with the top surface 120T of each silicon oxide layer 120a. In an embodiment, the planarization process may be a chemical mechanical polishing (CMP) process or an etching back process.

Figure 3E:
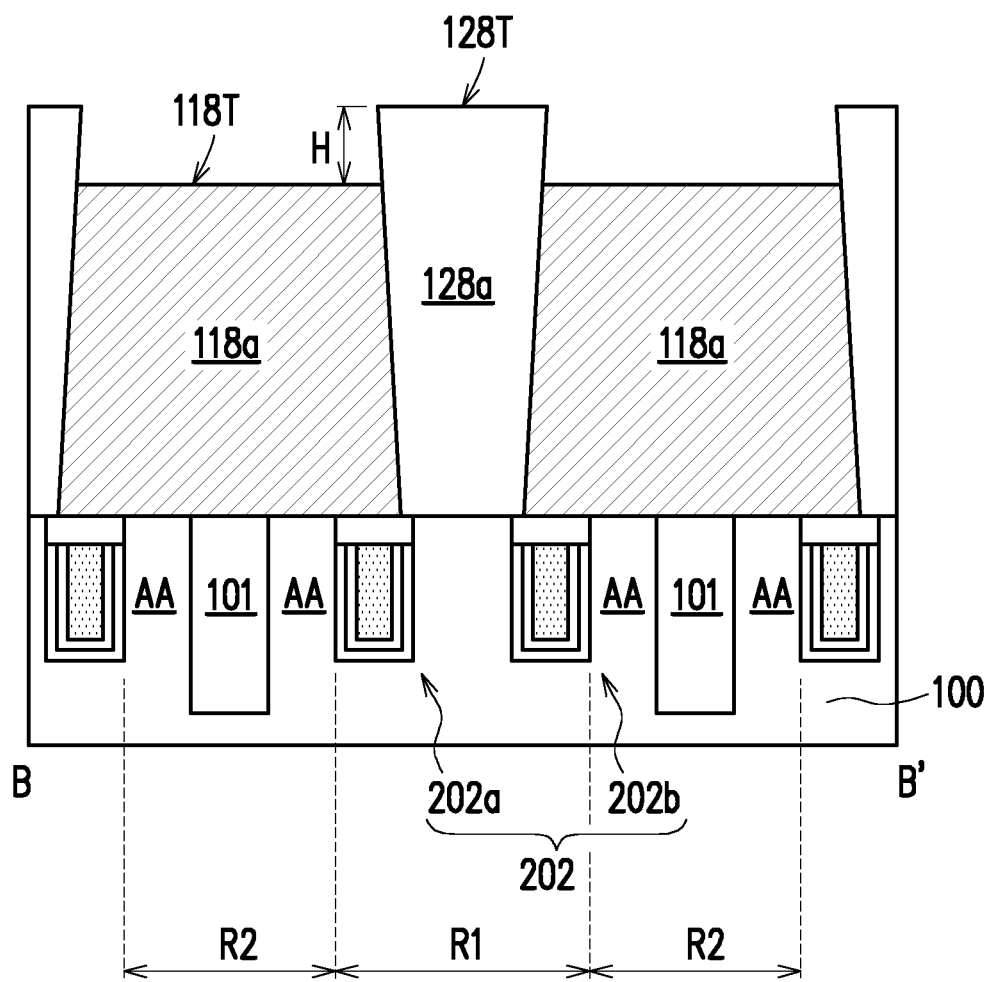

Referring to FIG. 3D and FIG. 3E simultaneously, the silicon oxide layers 120a are removed. As illustrated in FIG. 3E, a top surface 118T of each conductive layer 118a is lower than the top surface 128T of the first dielectric layer 128a. In an embodiment, there is a height difference H between the top surface 118T of each conductive layer 118a and the top surface 128T of the first dielectric layer 128a, where the height difference H may range between 20 nm and 150 nm.

Figure 4:
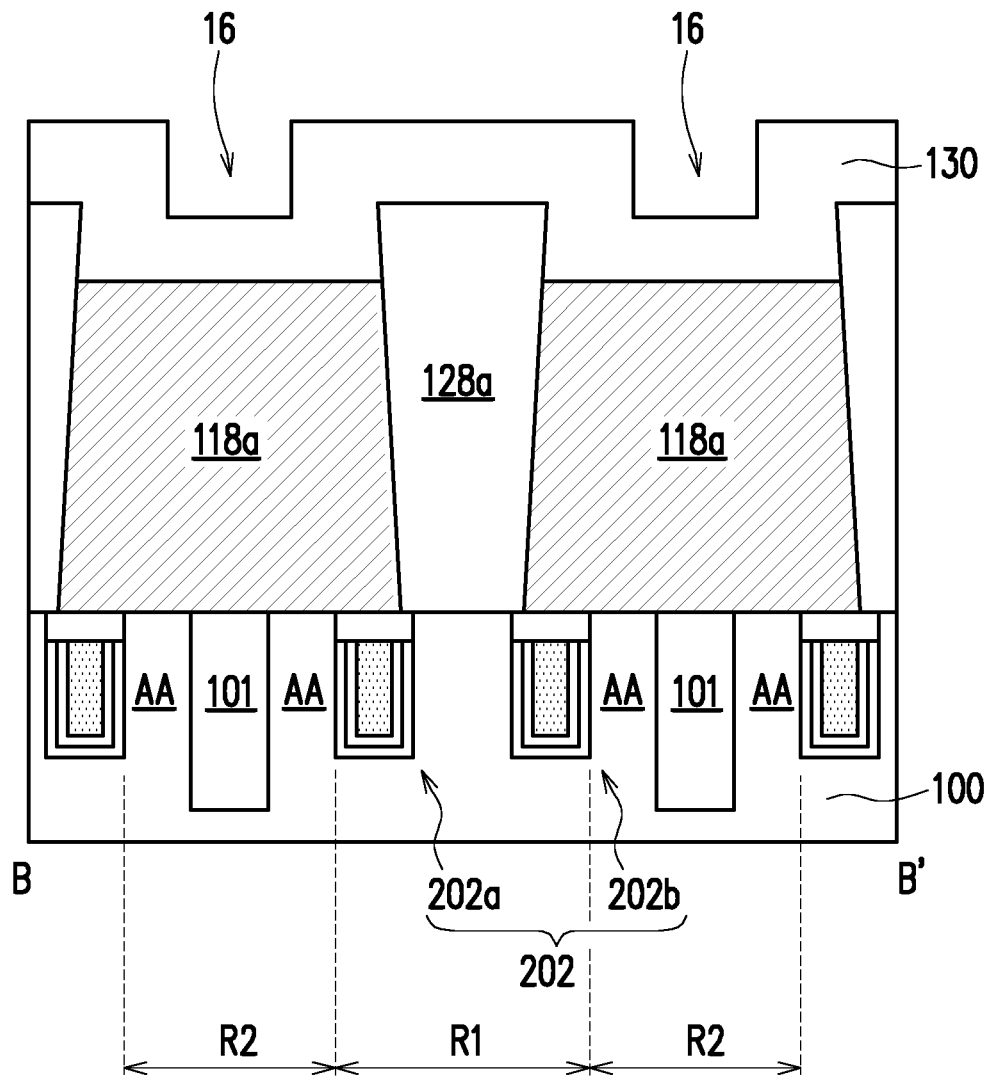

Referring to FIG. 3E and FIG. 4 simultaneously, a third dielectric layer 130 is formed over the substrate 100. The third dielectric layer 130 is formed on the conductive layers 118a and the first dielectric layer 128a conformally. As the height difference H exists between the top surface 118T of each conductive layer 118a and the top surface 128T of the first dielectric layer 128a, a top surface of the third dielectric layer 130 may be, for example, a continuous concave-convex structure. The third dielectric layer 130 located on the first dielectric layer 128a is a convex part, and the third dielectric layer 130 located on the conductive layer 118a is a concave part. As illustrated in FIG. 4, the third dielectric layer 130 over the substrate 100 in the second areas R2 has concave openings 16, and the concave openings 16 correspond to the isolation structures 101 in the substrate 100. In an embodiment, a material of the third dielectric layer 130 may be silicon nitride.

Figure 5A:
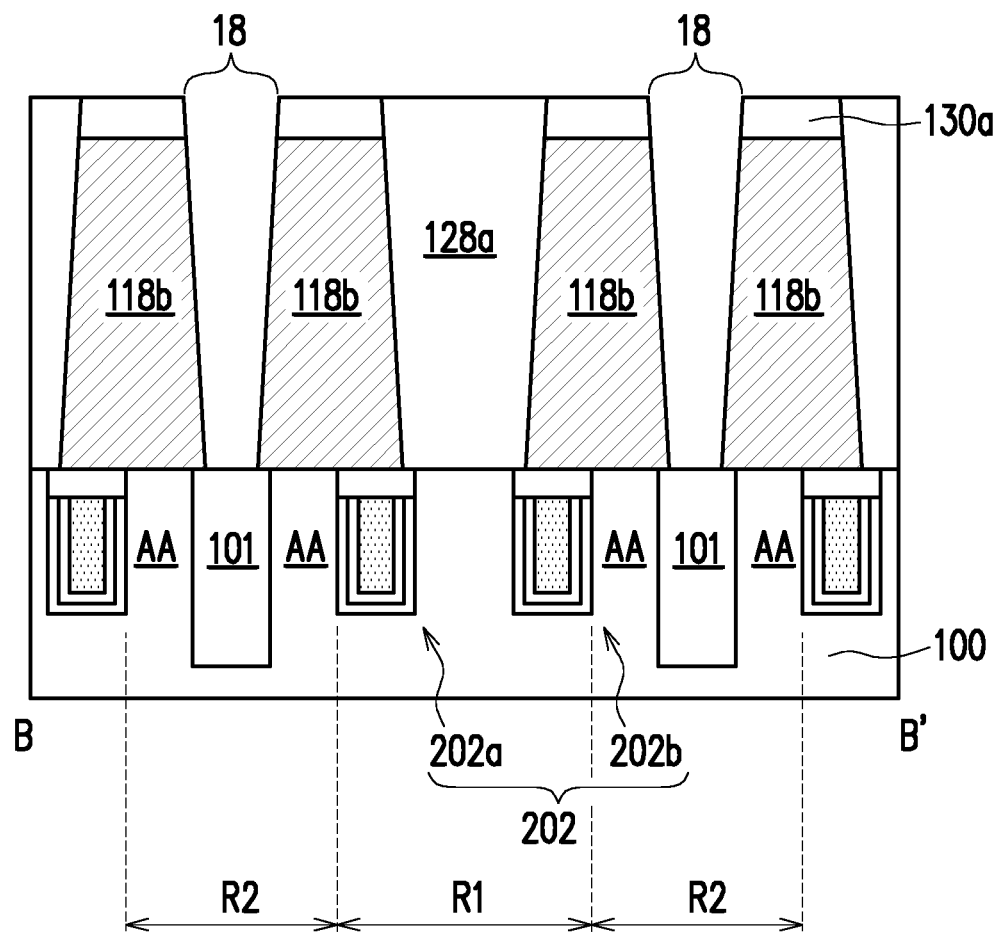

Referring to FIG. 4 and FIG. 5A simultaneously, an etching process is performed to blanketly remove a part of the third dielectric layer 130 and a part of the conductive layers 118a below the third dielectric layer 130, so as to form openings 18 in conductive posts 118b and the third dielectric layer 130a in the second areas R2. The openings 18 expose surfaces of the isolation structures 101 in the second areas R2. Additionally, when the etching process is performed, the third dielectric layer 130 in the first areas R1 is also removed to expose a top surface of the first dielectric layer 128a. On the other hand, each opening 18 divides each conductive layer 118a into two conductive posts 118b. In an embodiment, the openings 18 may be aligned with the isolation structures 101 in the second areas R2 without using any photolithography process, and thus, the openings 18 may be considered as self-aligned openings.

Figure 5B:
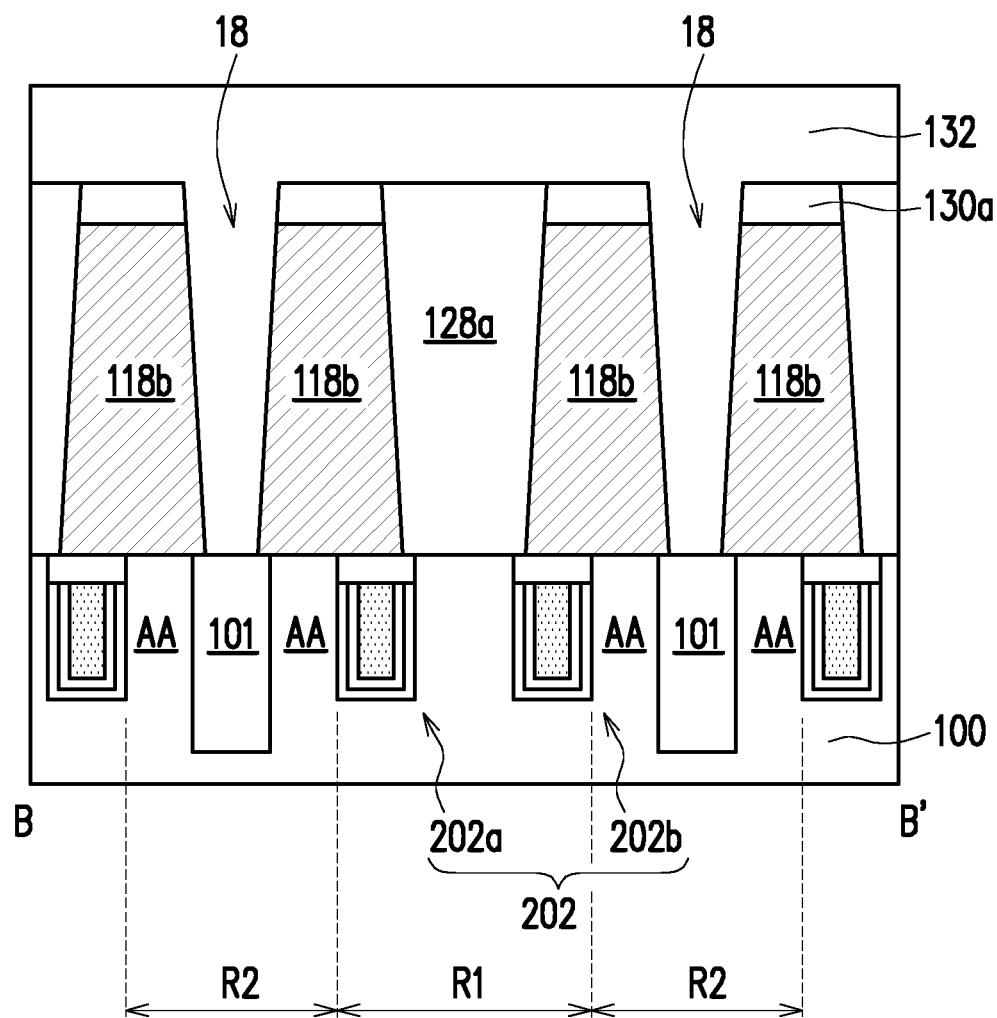

Referring to simultaneously FIG. 5A and FIG. 5B, a second dielectric material 132 is formed over the substrate 100. The second dielectric material 132 is filled in the openings 18 and covers the top surface of the remaining third dielectric layer 130a. In an embodiment, the second dielectric material 132 may be silicon nitride. In other words, the first dielectric material 128 is the same as the second dielectric material 132.

Figure 5C:
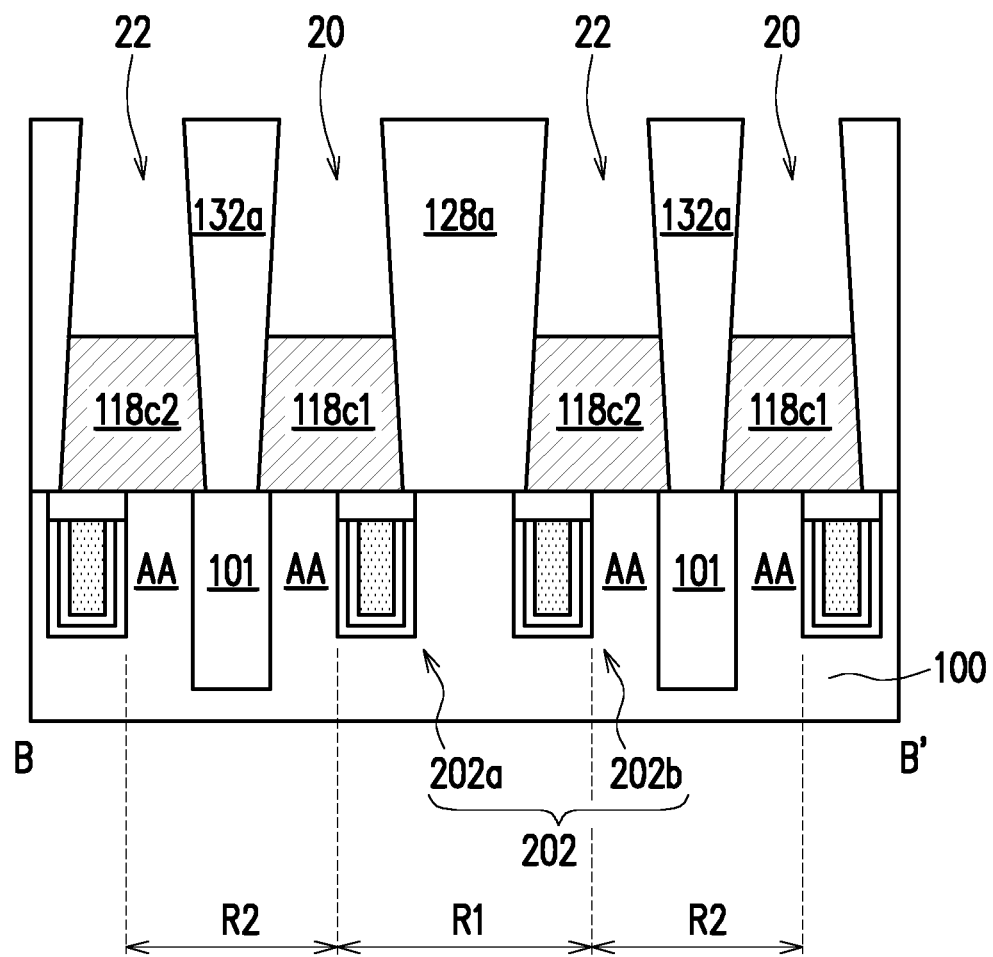

Referring to simultaneously FIG. 5B and FIG. 5C, a planarization process is performed to remove a part of the second dielectric material 132 and the remaining third dielectric layer 130a to expose top surfaces of the conductive posts 118b. In an embodiment, the planarization process may be a CMP process or an etching back process. Thereafter, an etching process is performed to remove a part of each conductive post 118b to form openings 20 on conductive posts 118c1 and form openings 22 on conductive posts 118c2. In an embodiment, the etching process may be a wet etching or a dry etching process. In an embodiment, as illustrated in FIG. 5C, bottom surfaces of the openings 20 are coplanar with bottom surfaces of the openings 22.

Figure 6:
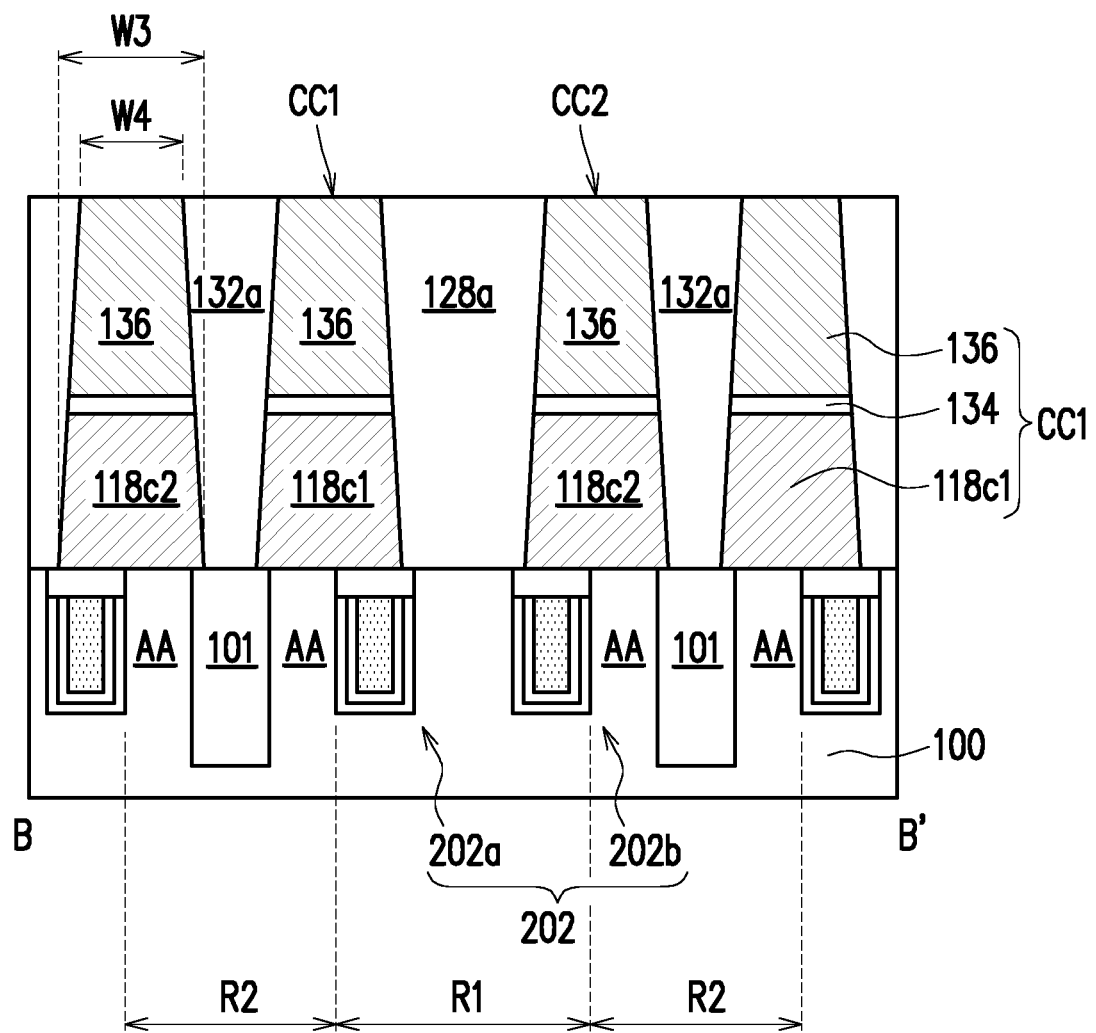
Figure 7:
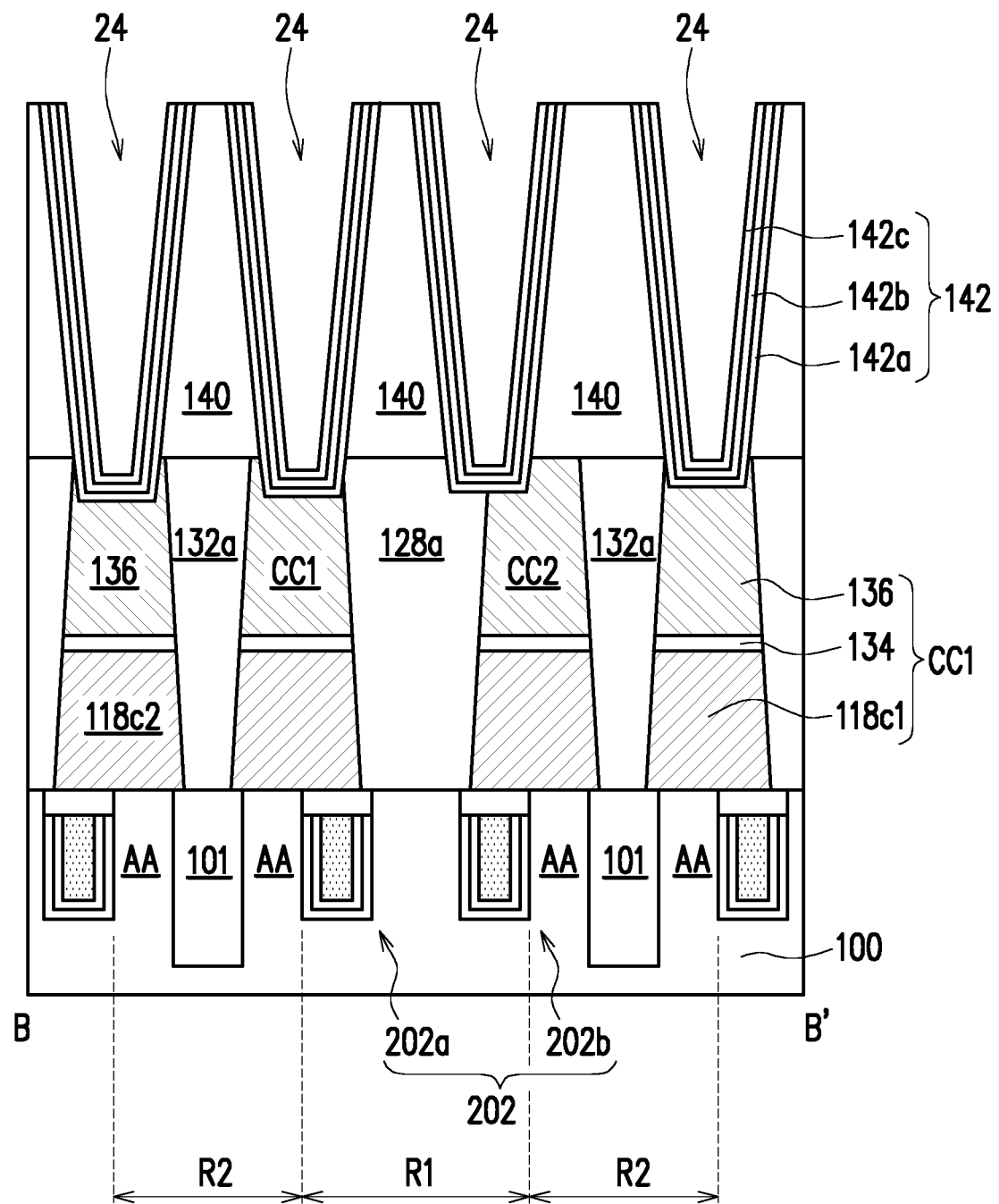

Referring to simultaneously FIG. 5C and FIG. 6, a metal silicide layer 134 and a metal layer 136 are formed on each conductive post 118c1 and each conductive post 118c2. In an embodiment, the metal silicide layer 134 may be, for example, TiSi, CoSi, NiSi or a combination thereof. In an embodiment, the metal layer 136 may be, for example, W. As illustrated in FIG. 6, a composite structure including the conductive post 118c1, the metal silicide layer 134 and the metal layer 136 may be considered as a capacitor contact CC1, and a composite structure including the conductive post 118c2, the metal silicide layer 134 and the metal layer 136 may be considered as a capacitor contact CC2. The capacitor contact CC1 is disposed at a terminal of each active area AA to electrically connect the active area AA with a subsequently formed capacitor 142 (as illustrated in FIG. 7). The capacitor contact CC2 is disposed at the other terminal of each active area AA to electrically connect the active area AA with the subsequently formed capacitor 142 (as illustrated in FIG. 7).

In an embodiment, as illustrated in FIG. 6, the capacitor contacts CC1 cover not only surfaces of the active areas AA, but also a part of top surfaces of the buried word lines 202a. Specifically, each capacitor contact CC1 has a bottom width W3 and a top width W4, where the bottom width W3 is greater than or equal to the top width W4. Namely, the capacitor contact CC1 may be a trapezoidal structure or rectangular structure. In an embodiment, the bottom width W3 of the capacitor contact CC1 ranges between 10 nm and 80 nm. In other words, the contact area between the capacitor contact CC1 and the active area AA may be maximized in the present embodiment, such that a resistance between the capacitor contact CC1 and the active area AA may be reduced. In this way, the reading speed of the DRAM may be increased, so as to enhance produce efficiency and reliability. In the same way, the capacitor contact CC2 may achieve the same effects and will not repeatedly described.

Additionally, in this circumstance, the second dielectric layers 132a respectively correspond to the isolation structures 101 on the substrate 100 in the second areas R2 to electrically isolate two adjacent conductive posts 118c1 and 118c2 (or the capacitor contacts CC1 and CC2) from each other.

Referring to FIG. 6 and FIG. 7 simultaneously, dielectric layers 140 are first formed over the substrate 100. Thereafter, a plurality of capacitor openings 24 are formed in the dielectric layers 140, and a plurality of capacitors 142 are respectively formed in the capacitor openings 24. The capacitors 142 are electrically connected with the active areas AA respectively through the capacitor contacts CC1 and CC2. Specifically, each capacitor 142 includes a lower electrode 142a, an upper electrode 142c and a dielectric layer 142b. The dielectric layer 142b is located between the lower electrode 142a and the upper electrode 142c. The lower electrodes 142a are electrically connected respectively with the capacitor contacts CC1 and CC2. In an embodiment, a material of the dielectric layers 140 may be, for example, silicon oxide. A material of the lower electrodes 142a and the upper electrodes 142c is, for example, titanium nitride, tantalum nitride, tungsten, titanium tungsten, aluminum, copper or metal silicide. Each dielectric layer 142b may include a high dielectric constant material layer (i.e., a dielectric material with a dielectric constant higher than 4), and a material thereof includes, for example, oxides of the following elements, such as hafnium, zirconium, aluminum, titanium, lanthanum, yttrium, gadolinium, tantalum or aluminum nitride or any combination of the elements.

It should be noted that as both the first dielectric layers 128a and the second dielectric layers 132a are made of silicon nitride, the first dielectric layers 128a and the second dielectric layers 132a may be employed as etching stop layers when the capacitor openings 24 are formed in the dielectric layers 140. The etching stop layers may prevent a short-circuit issue resulted from the electrical connected between the two adjacent capacitor contacts CC1 and CC2 due to over etching when the capacitor openings 24 are formed. On the other hand, even though an issue, for example, overlay shift or misalignment, occurs during the process of forming the capacitor openings 24, the first dielectric layers 128a and the second dielectric layers 132a made of silicon nitride may also prevent the over etching issue when the capacitor openings 24 are formed, thereby preventing the short-circuit issue from occurring to the two adjacent capacitor contacts CC1 and CC2. Thus, the capacitor contacts CC1 and CC2 of the present embodiment may be capable of maintaining the post structures without sharp corners generated at bottoms of the capacitor contacts CC1 and CC2.

In view of the foregoing, in the invention, the conductive layer is first formed, the first dielectric layers and the second dielectric layers are then formed in the conductive layers to divide each of the conductive layers into a plurality of conductive posts (or capacitor contacts). Thus, the invention can contribute to simplifying the method of manufacturing the capacitor contacts to maintaining the capacitor contacts in the post structures. Meanwhile, the bottom width of the formed capacitor contacts can be greater than or equal to the top width of the capacitor contact, such that the resistance between the capacitor contacts and the active areas can be reduced. Thereby, the reading speed of the DRAM can be increased, so as to enhance product efficiency and reliability. Moreover, the material of the spacers disposed on the sidewalls of the bit-line structures is substituted by silicon oxide in the invention to reduce the parasitic capacitance between each adjacent bit-line structures, so as to increase the memory performance. In addition, the material of the dielectric layers beside the capacitor contacts is substituted by silicon nitride in the invention, and thereby, a short-circuit issue occurring to the two adjacent capacitor contacts due to over etching can be prevented.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A method of manufacturing a DRAM, comprising:
   forming a plurality of isolation structures in a substrate to divide the substrate into a plurality of active areas;
   forming a plurality of word line sets in the substrate, wherein the word line sets extend in a Y direction and pass through the isolation structures and the active areas to divide the substrate into a plurality of first areas and a plurality of second areas, the first areas and the second areas are alternately arranged in an X direction, and the word line sets are located in the first areas;
   forming a conductive material on the substrate;
   removing a part of the conductive material to form a plurality of first openings in the conductive material, the first openings expose surfaces of the substrate in the first areas and divide the conductive material into a plurality of conductive layers, thereby the conductive layers are located on surfaces of the substrate in the second areas;
   filling a first dielectric material in the first openings so as to form a plurality of first dielectric layers on the substrate in the first areas, wherein top surfaces of the conductive layers are lower than top surfaces of the first dielectric layers;
   forming a plurality of second dielectric layers respectively in the conductive layers, wherein each of the second dielectric layers divides the corresponding conductive layer into two conductive posts; and
   forming a plurality of capacitors respectively on the conductive posts.

2. The method according to claim 1, wherein the material of the first dielectric layers comprises silicon nitride, and the material of the second dielectric layers comprises silicon nitride.

3. The method according to claim 1, wherein the second dielectric layers respectively correspond to the isolation structures in the substrate in the second areas to electrically isolate each two adjacent conductive posts from each other.

4. The method according to claim 1, further comprises:
   forming a plurality of bit-line structures on the substrate, wherein the bit-line structures extend in the X direction and cross the word line sets, wherein the conductive material between bit-line structures.

5. The method according to claim 4, further comprises:
   forming a plurality of spacers respectively on sidewalls of the bit-line structures.

6. The method according to claim 5, wherein each of the spacers comprises a first spacer and a second spacer, and the first spacer is located between the bit-line structures and the second spacer, and the first spacers comprise silicon nitride, and the second spacers comprise silicon oxide.

7. The method according to claim 1, wherein a method of forming the second dielectric layers comprises:
   forming a third dielectric layer conformally on the conductive layers and the first dielectric layers, wherein a top surface of the third dielectric layer is a continuous concave-convex structure;
   performing an etching process to remove the third dielectric layer and the conductive layers below the third dielectric layer by using the third dielectric layer with the continuous concave-convex structure, so as to form a plurality of second openings exposing the isolation structures in the second areas; and
   filling a second dielectric material in the second openings.

8. The method according to claim 7, wherein the third dielectric layer located on the first dielectric layers is a convex part, and the third dielectric layer located on the conductive layers is a concave part.

9. The method according to claim 1, wherein after forming the second dielectric layers further comprises:
   removing a part of the conductive posts to form a plurality of third openings;
   forming a metal silicide layer and a metal layer in each of the third openings, wherein the conductive layers, the metal silicide layer and the metal layer in each of the third openings is a composite structure as a capacitor contact.

10. The method according to claim 1, wherein each of the word line sets comprises two buried word lines.

11. The method according to claim 10, wherein each of the conductive posts cover a part of a top surface of the active area and a part of a top surface of one of the two buried word lines.

12. The method according to claim 1, wherein each of the conductive posts has a bottom width and a top width, and the bottom width is greater than or equal to the top width.

13. The method according to claim 1, wherein the active areas of two adjacent columns are disposed in a mirror manner.

14. The method according to claim 1, wherein a material of the first dielectric layers is the same as a material of the second dielectric layers.

* * * * *